United States Patent [19]

Beitner

[11] Patent Number: 4,704,870
[45] Date of Patent: Nov. 10, 1987

[54] THERMOELECTRIC COOLER

[75] Inventor: Shlomo Beitner, Chicago, Ill.

[73] Assignee: Vapor Corporation, Chicago, Ill.

[21] Appl. No.: 865,249

[22] Filed: May 19, 1986

Related U.S. Application Data

[63] Continuation-in-part of Ser. No. 601,994, Apr. 19, 1984, Pat. No. 4,627,242.

[51] Int. Cl.⁴ .............................................. F25B 21/02
[52] U.S. Cl. ........................................... 62/3; 62/258; 62/457; 312/236
[58] Field of Search ...................... 62/3, 258, 457, 261; 312/236

[56]     References Cited
U.S. PATENT DOCUMENTS

| | | | |
|---|---|---|---|
| 2,895,311 | 7/1959 | Spalvins | 62/258 |
| 3,111,166 | 11/1963 | Munz et al. | 62/3 X |
| 3,347,060 | 10/1967 | Barkan | 62/457 |
| 4,383,414 | 5/1983 | Beitner | 62/3 |

Primary Examiner—Lloyd L. King
Attorney, Agent, or Firm—Francis J. Lidd

[57]     ABSTRACT

A thermoelectric cooler (10) having a storage compartment (36) with insulated inside walls forming an access opening on one side opposite a back wall (42a) of substantially the same size includes an insulated door (40) movable between a closed position sealing said access opening and an open position displaced from one edge of the access opening for providing direct access to the interior of said storage compartment over the entire area of the access opening. The insulated door (40) comprises a pair of door segments pivotally interconnected about a median axis in parallel with one edge of the access opening of the storage compartment. An overcenter spring (68) is interconnected between the door segments to exert a resilient biasing force tending to pivot the door segments in one direction about the hinge (58) axis when the spring is on one side thereof and an opposite direction when the spring is moved to the opposite side of the median axis. A guide (76, 80, 82) and follower system is provided adjacent the storage compartment interacting with the door segments for guiding the door segments in coplanar alignment while the spring is on one side of the median axis and as the door approaches the closed position. When the door is moved toward the open position the spring moves to the other side of the median axis and pivots one of the door segments away from the coplanar position towards an angularly tranverse position so that a minimum of adjacent space (38) is required even though the door is fully displaced to provide access over the entire area of the access opening.

20 Claims, 5 Drawing Figures

THERMOELECTRIC COOLER

RELATED APPLICATIONS

This application is a continuation-in-part of co-pending U.S. patent application Ser. No. 601,994 filed Apr. 19, 1984 for a thermoelectric cooler, now Pat. No. 4,627,242, which parent application is incorporated herein by reference.

BACKGROUND OF THE INVENTION

A. Field of the Invention

The present invention relates to coolers and insulated storage compartments and more particularly to thermoelectric coolers of the type that are especially adapted for use in harsh environments such as locomotive cabs and the like which require highly efficient cooling action and a minimum amount of space for the net volume of storage provided. More particularly, the present invention relates to a new and improved thermoelectric cooler of the character described having an insulated door formed with a pair of pivotally interconnected segments and movable between a closed position wherein the door segments are in coplanar alignment and an open position wherein the entire area of the access opening of the cooler compartment is exposed yet a minimum volume of space outside the cooler is required for the door while in the open position, thus resulting in a minimum space requirement per unit volume of the storage compartment.

B. Description of the Prior Art

Operator cabs in heavy machinery, railroad locomotives and other vehicles often present a particularly harsh environment for coolers and storage compartments which are used by the operators to keep food items, water and beverages cool. Oftentimes the environmental temperature in these cabs is high, space is at a premium and substantial vibration and movement is often a continuous factor to be dealt with. Nevertheless, cooling units are provided since it has been demonstrated that provision of a cooling compartment for food and beverages enhances operator efficiency. Typically, thermoelectric or solid state coolers have been successfully used in these harsh environments and one such cooler is shown in U.S. Pat. No. 4,383,414 incorporated herein by reference. The aforementioned co-pending parent application hereof provides a significant improvement over the solid state cooler disclosed in U.S. Pat. No. 4,383,414 and the cooler of the present application provides a significant improvement particularly in the door construction and minimizing the overall space required. Other thermoelectric or solid state refrigerators or coolers are disclosed in U.S. Pat. Nos. 3,209,547; 4,326,383 and 4,400,948.

OBJECTS OF THE INVENTION

It is an object of the present invention to provide a new and improved thermoelectric or solid state cooler of the character described and more particularly a thermoelectric cooler which is adapted for use in harsh environments such as operator cabs in heavy machinery, locomotives and other vehicles where the temperatures are hot and the space or volume available is extremely limited.

Yet another object of the present invention is to provide a thermoelectric cooler or heat insulated enclosure for storing foodstuffs and beverages wherein a novel cooler door is provided to permit full access to the interior of the storage compartment over the entire access opening area when the door is open and yet require a minimum space or volume outside the cooler for the door when the door is in the open position, thereby minimizing the overall space or volume being required for a cooler having a given volume capacity of internal storage.

Another object of the present invention is to provide a new and improved insulated door for a cooler or storage compartment of the character described wherein the door when open provides full access to the interior of the cooler yet requires only a minimum amount of additional space or volume for the door when in a fully opened position.

Another object of the present invention is to provide a new and improved cooler or insulated storage compartment of the character described which includes a door having pivotally interconnected segments and an over-center spring system for maintaining the segments in coplanar alignment when the cooler door is closed and automatically pivoting at least one of the segments away from the coplanar alignment as the door is moved into the open position so as to occupy a minimum amount of external space.

BRIEF SUMMARY OF THE INVENTION

The foregoing and other objects and advantages of the present invention are accomplished in a new and improved thermoelectric or solid state cooler having an internal storage compartment for foodstuffs, beverages and the like with insulated walls forming an access opening on one side opposite a spaced apart fixed wall of a size substantially matching that of the access opening. An insulated door is supported for movement between a closed position sealing the access opening and an opposite position displaced from one edge of the opening so that direct access to the interior of the storage compartment is provided over the entire area of the access opening without obstruction. The insulated door comprises a pair of door segments pivotally interconnected about a median axis in parallel alignment with one edge of the access opening of the storage compartment. A spring is interconnected between the door segments and exerts a resilient biasing force tending to pivot the door segments in one direction about the median axis when the spring is one one side of the axis and in an opposite direction when the spring is moved to the opposite side of the axis.

A guide system is provided adjacent the storage compartment interacting with the door segments for guiding the door segments in coplanar alignment while the spring is on one side of the median axis as the door approaches the closed position and for automatically pivoting at least one of the door segments away from the coplanar position towards an angularly transverse alignment relative to the other door segment as the door is moved towards a fully open position. The cooler door thus provides a maximum of access area available to the interior of the storage compartment when open and yet only a minimum of external space is needed for the door structure when fully open.

BRIEF DESCRIPTION OF THE DRAWINGS

For a better understanding of the present invention reference should be had to the following detailed description taken in conjunction with the drawings, in which.

DETAILED DESCRIPTION OF THE PRESENT INVENTION

Figure 2:
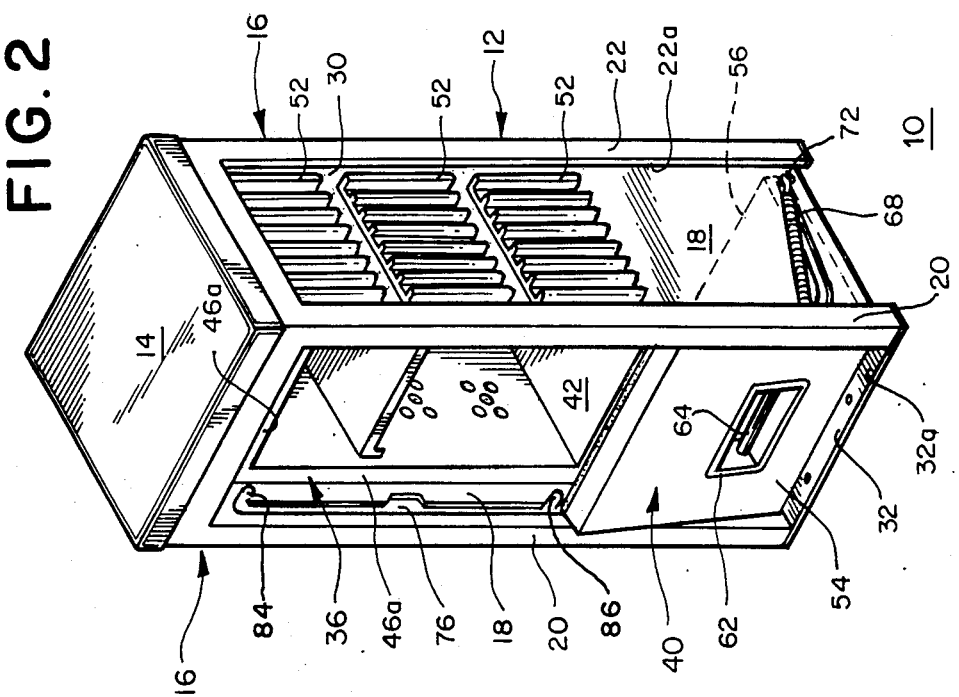
FIG. 2 is a front elevational perspective view of the cooler showing the cooler door in a fully open position and with one of the side panels of the outer enclosure removed.

Referring now more particularly to the drawings, therein is illustrated a new and improved thermoelectric or solid state cooler referred to generally by the reference numeral 10 and constructed in accordance with the features of the present invention. The cooler 10 is of an upright type designed to occupy a mimimum of floor space in the operator cab of a railroad locomotive or other types of machinery or vehicles, and includes an upstanding frame 12 having a top wall 14, a pair of generally rectangularly shaped opposite side walls 16, each of which includes a rectangular inside wall panel 18, preferably formed of sheet metal and having an integrally formed front corner post 20 at the forward edge and similarly shaped integrally formed rear corner post 22 at the rearward edge.

Figure 4:
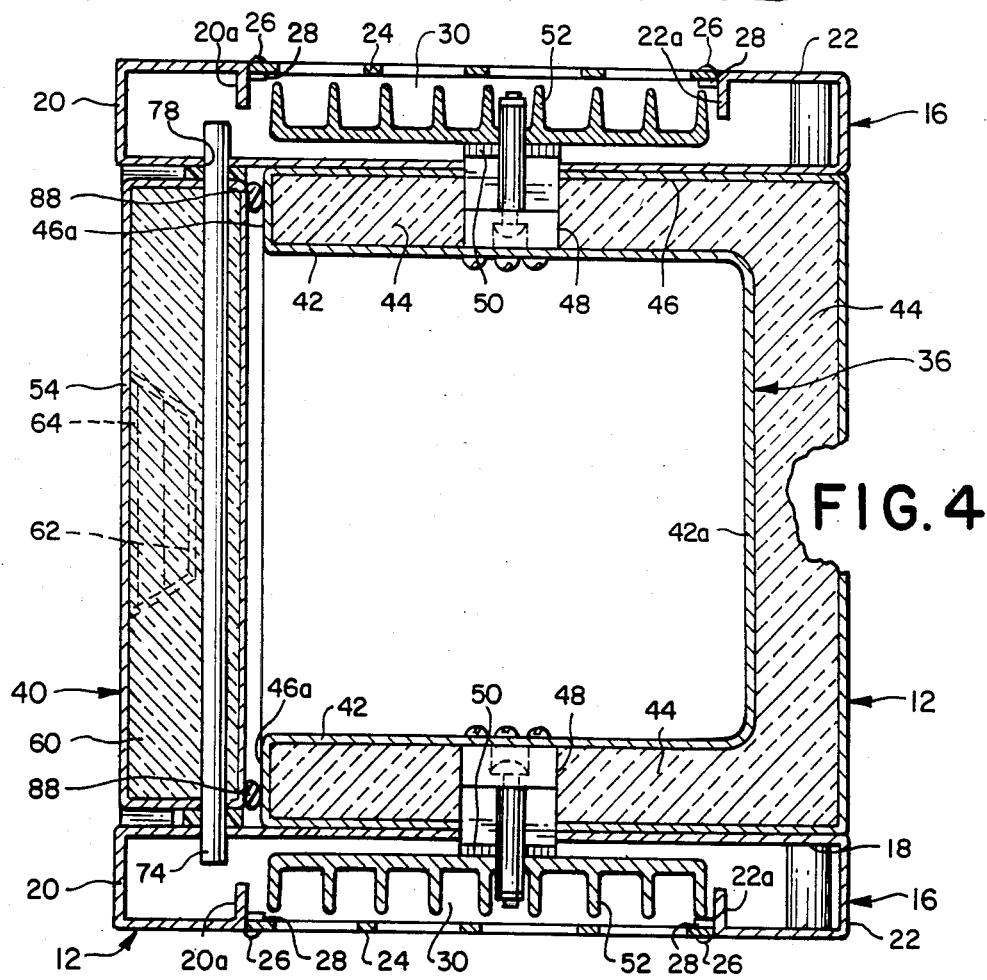
FIG. 4 is a horizontal transverse cross-sectional view of the cooler taken substantially along lines 4—4 of FIG. 3.

The front corner posts 20 are formed with in-turned flanges 20a and similar in-turned flanges 22a on the rear corner posts are provided. In between each pair of facing opposed flanges there is provided a removable rectangular vent panel 24 normally secured in place by removable fasteners 26 having self-tapping threaded shanks which engage tabs or blocks 28 secured to the flanges 20a and 22a as best shown in FIG. 4. Each vent panel 24 has a plurality of vent openings designed to permit the free flow of air into and out of a relatively large volume rectangular open space or heat exchange chamber 30 defined between the inside panel 18 and the outer surface of each side wall 16. A similar vent panel 24 is provided on the back side of the cooler frame 12 to permit air flow into and out of a similar open space 30 between the opposite rear corner posts 22 as shown in FIG. 4. If desired, the upstanding frame structure 12 can be provided with an angular foot plate 32 secured to forward faces of the corner post structures 20 and having a lower flange 32a adapted to be bolted or otherwise fastened to a floor surface 34 of a cab or enclosure in which the cooler is permanently mounted.

Figure 1:
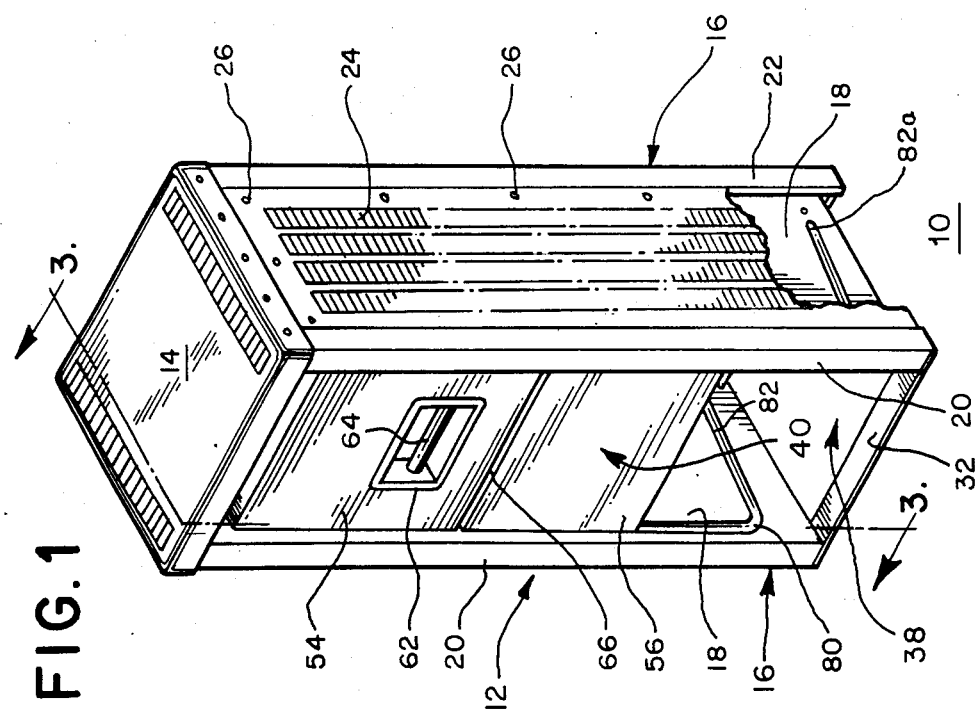
FIG. 1 is a front elevational perspective view of a new and improved thermoelectric or solid state cooler constructed in accordance with the features of the present invention.
Figure 3:
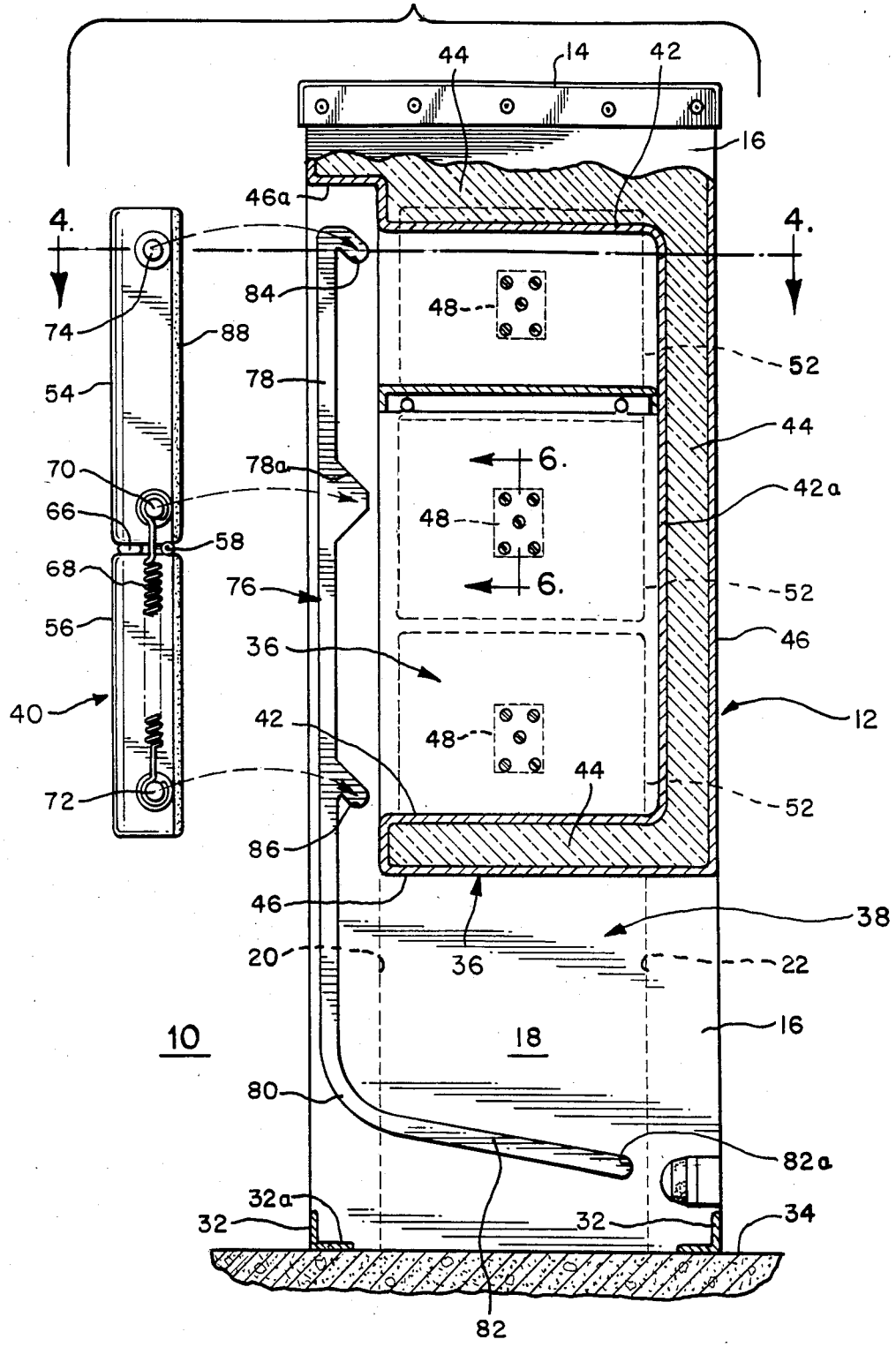
FIG. 3 is a vertical cross-sectional view of the cooler taken substantially along lines 3—3 of FIG. 1 and illustrating the insulated door in an exploded view outwardly away from a fully closed position.
Figure 3A:
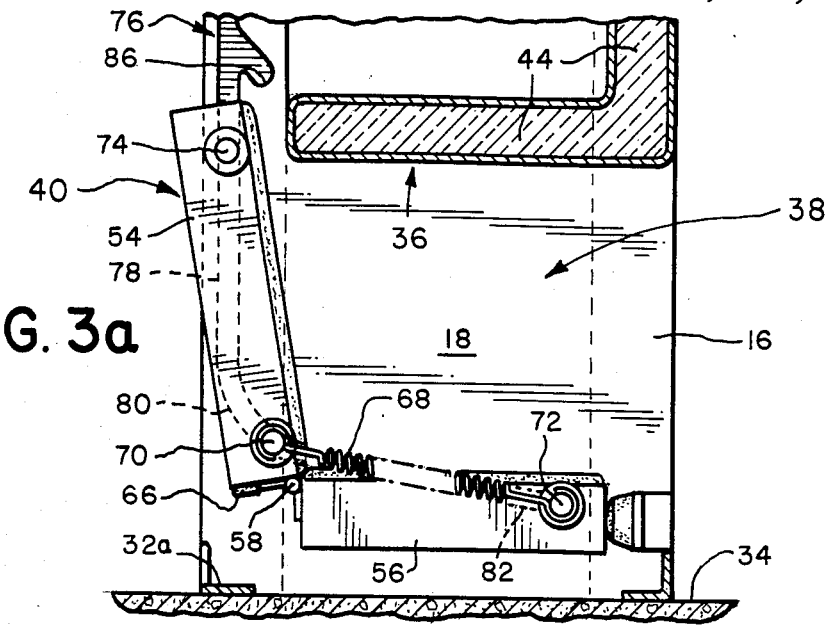
FIG. 3a is a fragmentary cross-sectional view similar to FIG. 3 but illustrating the door in a fully opened position.

In accordance with an important feature of the present invention approximately two-thirds of the volume or space between the inside panels 18 of the rectangular side structure 16 of the enclosure is occupied by a storage compartment 36 and a lower one-third of the space or volume is normally open as indicated by the reference numeral 38 in FIGS. 1, 3, and 3a. This open space or volume 38 and its associated frontal area beneath the storage compartment 36 is provided for accommodating both segments of an insulated door 40 constructed in accordance with the features of the present invention, when the door is in a fully open position as illustrated in FIGS. 2 and 3a as will be described in greater detail hereinafter.

As described in greater detail in the aforementioned co-pending parent application incorporated herein by reference, the storage compartment 36 includes an inner liner 42 (reference FIG. 3) formed of thermoconductive material such as aluminum, and encased in insulating foam 44 of polyurethane or other foam-type insulating material having good heat insulating characteristics. The insulating foam is encased in an outer shell 46, opposite sides of which are secured to the inside of corner post structures 20 of the cooler frame side structure 16. Opposite side walls of the shell 46 and the back wall thereof are formed with rectangular openings therein aligned in a vertical array, and matching openings are provided in the insulating material 44 in order to accommodate a plurality of coupling pads 48 secured to the inner shell 42 of the storage compartment and having an outer surface adapted to support a thermoelectric module 50 mounted on the outer face of the coupling pad in the open spaces 30. Each module is provided with a fin-type heat exchanger 52 secured to the outer face of the module and designed to dissipate heat taken from the interior of the storage chamber when the thermoelectric modules are energized. Heat dissipated from the finned type heat exchangers 52 is carried away by free convecting ambient air flow passing through the chambers 30 while moving into and out of the chambers through the vent openings in the vented panels 24.

In accordance with the invention, the liner 42 of the storage compartment 36 includes a generally rectangular shaped back wall 42a disposed inwardly of and substantially the same size as a frontal access opening to the interior of the storage chamber defined around the periphery thereof by flange portions 46a of the outer wall or shell 46. The large unobstructed access opening at the front of the storage compartment 36 is readily accessible and the full area thereof is completely uncovered as shown in FIGS. 2 and 3a when the novel insulated door 40 is moved from the closed position (FIGS. 1 and 4) sealing off the front of the access opening to the fully open position as illustrated in FIGS. 2 and 3a.

The insulated door 40 includes an upper door 54 and a lower door 56 of approximately the same size and the doors are interconnected for pivotal action relative to one another by a piano type hinge 58 having one leaf secured to the lower edge of the upper door 54 and another leaf secured to the upper edge of the lower door 56. The hinge 58 provides for pivotal action between the upper and lower doors about an essentially median axis approximately midway between upper and lower edges of the total door structure 40 when the upper door 54 and the lower door 56 are aligned in a substantially coplanar alignment as shown in FIG. 3 when the door is closed as illustrated in FIG. 1.

Each of the doors is provided with an inner shell and an outer shell secured thereto with insulating foam 60 sandwiched between the shells. The upper door has an indented handle fixture 62 supporting a vertical grab-bar 64 for manually moving the door between open and closed positions as desired. The leaves of the hinge 58 serve as stops for preventing pivotal movement of the lower door 56 in a clockwise direction relative to the upper door 54 when the doors are in coplanar alignment and the hinge permits free pivotal movement in an opposite direction as will be described. A sealing strip 66 of resilient material is provided outwardly of the hinge 58 to seal between the upper and lower doors to prevent heat loss through the hinge area.

In accordance with the present invention, the upper and lower doors 54 and 56 are biased to pivot toward and away from one another by means of a pair of elongated coil springs 68 mounted on opposite sides of the door edges and normally enclosed within the side wall structures 16 of the frame 12. Upper ends of the coil springs are connected to opposite end portions of an elongated guide rod 70 which is spaced a short distance upwardly of the hinge 58 and outwardly of the hinge axis towards the outer face of the upper door 54. Lower ends of the springs 68 are similarly connected to outer end portions of a lower guide rod 72 positioned a short distance from a lower end of the lower door 56 and outwardly towards the outer face thereof with respect to the axis of the hinge 58. When the guide springs are positioned outwardly of the axis of the hinge 58 as shown in FIG. 3, the upper and lower doors 54 and 56 are maintained in substantially coplanar alignment for movement toward a closed and sealing position over the large area of the access opening in the front of the storage chamber. When the elongated coil springs 58 are positioned inwardly of the pivot axis of the hinge 58, as shown in FIGS. 2 and 3a, the lower door 56 is biased in a counter-clockwise direction relative to the upper door tending to pivot the lower door toward a folded-up position as illustrated.

An upper portion of the upper door 54 is also provided with a guide rod 74 similar to the guide rods 70 and 72. Outer end portions of these similar to the guide rods 70 adapted to move and ride within elongated tracks 76 formed in the inside panels 18 of the cooler side frame structures 16. Each guide track 76 includes an elongated vertically extending first position 78 spaced outwardly and parallel of the outer faces 46a of the cooling compartment shell which flank and surround the access opening. At the lower end, each guide track 76 is formed with an inwardly curved segment 80 and a rearwardly and downwardly sloping inclined segment 82 directed generally transversely of the vertical segment 78 and terminating in a blind-end 82a spaced below and generally in alignment with the plane of the back wall 42a of the liner of the storage compartment 36 as illustrated in FIG. 3.

The vertical segment 78 of the guide tracks 76 is in communication with a pair of vertically spaced downwardly and inwardly sloping short guide segments 84 and 86 which serve to guide the door 40 into a fully closed and sealed position (FIG. 4) wherein a peripheral sealing gasket 88 on the inside face of the upper and lower doors 54 and 56 is pressed tightly against the surrounding face flange 46a of the storage chamber. The vertical guide track segments 78 are also provided with an enlarged, trapezoidal-shaped segment 78a midway between the short guide segments 84 and 86 for accommodating the middle guide rod 70 when the door is closed.

When the upper and lower doors 54 and 56 are in substantial coplanar alignment, and the guide rods 70, 72 and 74 are moving in the vertical segment 78 of the guide tracks 76 toward or away from the closed position, the over-center bias springs 68 are effective to maintain the device in substantial coplanar alignment as the upper pair of guide rods 70 and 74 pass in front of the track segments 84, 78a and 86. When the door is moved to an uppermost confronting position as illustrated in FIG. 3, with the upper rod 74 engaging the upper end of the vertical segment 78 of the guide tracks, the door can then be moved bodily inwardly and downwardly and the upper rod 74 and lower rod 72 slide downwardly and inwardly in the respective short guide segments 84 and 86 to effect a tight compressive seal of the gaskets 88 as illustrated best in FIG. 4. The short, sloping guide segments 84 and 86 provide a wedging action to insure that tight sealing is maintained and the weight of the door structure aids in maintaining the door in a tightly sealed, closed condition.

When it is desired to open the door, the handle 64 is grasped and the door is pulled upwardly and outwardly so that the guide rods 74 and 72 move outwardly into the main vertical track segments 78. The door can then be moved downwardly in the track aided by its own weight and during this downward travel, the bias springs 68 are effective to maintain the doors 54 and 56 in substantial coplanar alignment, even as the upper guide rods 74 and 70 pass by the track segments 78a and the lower short guide segments 86. When the lower guide rod 72 begins to move into the curved segments 80 of the guide tracks, the lower door 56 is pivoted in a counter-clockwise direction relative to the upper door which is still constrained to move in a vertical path. As the springs 68 move overcenter and inwardly beyond the pivot axis of the hinge 58, the springs begin to exert additional biasing forces on the lower door 56 tending to pivot the lower door in a counter-clockwise direction relative to the upper door 54. Further downward travel is continued until the upper edge of the upper door 54 is spaced at a level even with the lower edge of the access opening as shown in FIG. 3a, thus providing a full and complete unobstructed access to the interior of the storage compartment 36. In this position, the lower door 56 has been pivoted to a substantially horizontal position and the lower guide rod 72 is seated against the blind-end 82a of the sloping lower guide sections 82 of the track.

Because of the unique pivoting action of the lower door relative to the upper door, the open space 38 required below the storage chamber 36 is minimized even though full access to the open front of the storage chamber 36 is provided. When it is desired to close the door, the handle 64 is grasped and the upper door 54 is moved vertically upwardly guided by the guide rods 70 and 74 moving in the vertical segments 78 of the guide track until the upper guide rod 74 reaches the upper end of the track. As the upper door first begins to travel upwardly from the fully open position, the lower door 56 begins to pivot in a clockwise direction as the lower guide rod 72 moves outwardly and up the sloping guide track segments 82. Continued movement results in the lower guide rod 72 moving through the curved segments 80 and into the vertical segment 78 of the track, and as this occurs, the bias springs 68 move over-center and forwardly of the pivot axis of the hinge 58 to exert a clockwise biasing force on the lower door 56 to maintain the doors 54 and 56 in a coplanar position during continued upper movement and while final sealing movement is achieved as previously described.

Although the present invention has been described in terms of a preferred embodiment, it is intended to include those equivalent structures, some of which may be apparent upon reading this description, and others that may be obvious after study and review.

Therefore, I claim:

1. A thermoelectric cooler, having
   a storage compartment with insulated walls having inner thermally conductive portions, thermoelectric means coupled to said conductive portions for cooling the interior of said storage compartment, said walls forming
   an access opening on one side opposite a spaced apart, fixed wall of a size substantially matching that of said access opening; and
   an insulated door comprising; means supporting said door for vertical movement relative to said compartment between a first position closing said access opening and a second position open and spaced away from said access opening adjacent an edge thereof allowing access to the interior of said compartment over the whole area of said access opening said door occupying a first vertical space in said closing position and occupying a substantially reduced vertical space in said open position;
   first means for securing said door tightly against adjacent edges of said walls surrounding said access opening when said door is in said first position;
   second means for biasing said door toward said second position away from first position whereby spaced required for said door is minimized.

2. The thermoelectric cooler of claim 1 wherein;
   said door comprises, first and second segments pivotally interconnected about a pivot axis extending across said access opening when said door is in said first position with said axis parallel of said edge of said access opening;
   said second means biasing said first and second segments into substantially coplanar alignment when said door is moved toward said first position and biasing said first and second segments to pivot away from said coplanar alignment when said door is moved toward said second position.

3. The thermoelectric cooler of claim 2 wherein said second means includes;
   means for guiding said first and second segments of said door from portions thereon spaced apart from said pivot axis on opposite sides thereof to move along a common path as said door is moved toward said first position and to bias at least one of said segments toward a path divergent from a path followed by the other segment as said door is moved toward said second position.

4. The thermoelectric cooler of claim 3 wherein said path of said other segment is aligned with said common path and wherein said divergent path is in a direction extending toward a plane occupied by said fixed wall of said storage compartment.

5. The thermoelectric cooler of claim 3 wherein said divergent path is generally transverse to said common path.

6. The thermoelectric cooler of claim 2 wherein said second means includes resilient tension means extending between said first and second door segments on one side of said pivot axis for maintaining said segments in said coplanar alignment as said door is moved toward said first position.

7. The thermoelectric cooler of claim 6 wherein said resilient tension means is connected to move to an opposite side of said pivot axis for biasing at least one of said door segments to pivot away from said coplanar position as said door is moved toward said second position.

8. The thermoelectric cooler of claim 7 wherein said second means comprises at least one guide track mounted in fixed relation to said storage compartment and follower means on each of said door segments mounted for movement in said guide track as said door is moved between said first and second positions.

9. The thermoelectric cooler of claim 8 wherein said guide track includes a first portion for guiding said follower means on each door segment along a common path toward said first position and a second portion for guiding at least one of said follower means to move along a path angularly divergent from said common path as said door is moved toward said second position.

10. The thermoelectric cooler of claim 9 wherein said resilient tension means is connected between said follower means on said first and second door segments and is moved to cross from one side of said pivot axis to the other as said one follower means travels on said divergent path when said door is moved toward said second position.

11. The thermoelectric cooler of claim 10 wherein said resilient tension means is moved to cross from said other side toward said one side of said pivot axis as said one follower means is moved to travel in said common path of said guide track.

12. The thermoelectric cooler of claim 11 wherein said first means includes a pair of guide track segments in communication with said common path of said guide track for guiding said door segments toward said first position.

13. The thermoelectric cooler of claim 6 including stop means between said door segments adjacent said pivot axis for maintaining said door segments in substantial coplanar alignment against the force applied by said tension means on one side of said pivot axis.

14. A heat insulating enclosure comprising a storage compartment having insulated walls with an access opening on one side opposite a back wall of substantially the same size, an insulated door movable between a closed position sealing said access opening and an open position displaced from one edge of said access opening providing direct access to the interior of said compartment over the entire area of said access opening, said door comprising a pair of door segments pivotally interconnected about a median axis in parallel with said one edge, spring means interconnected between said door segments exerting a resilient biasing force tending to pivot said door segments in one direction about said median axis when said spring means is positioned on one side of said median axis and in an opposite direction when said spring means is positioned on an opposite side of said median axis, and guide mans adjacent said storage compartment interacting with said door segments for guiding said door segments in coplanar alignment while said spring means is on said one said of said median axis as said door approaches said closed positions and for pivoting one of said door segments out of said coplanar position toward a position angularly transverse to the other door segment as said door moves toward said open position.

15. The heat insulated enclosure of claim 14 wherein said guide means includes a guide track mounted in fixed position relative to said access opening of said storage compartment, and a plurality of followers mounted on said door segments and slidably movable in said guide track as said door is moved between said open and closed positions.

16. The heat insulated enclosure of claim 15 wherein said guide track includes a first portion in front of said access opening and extending beyond said one edge and a second portion angularly divergent from said first portion at a point beyond said one edge for pivoting said other door segment to travel toward said angularly diverse position as said door is moving toward said open position.

17. The heat insulated enclosure of claim 15 wherein said spring means in interconnected between a follower on each of said door segments.

18. The heat insulated enclosure of claim 17 including stop means for limiting pivotal movement between said door segments in said one direction when said spring means is positioned on said one side of said median axis to maintain said door segments in substantially coplanar alignment.

19. The heat insulated enclosure of claim 16 wherein said guide track includes a plurality of spacedapart segments in communication with said first portion sloped toward said access opening for guiding a plurality of said followers on said door segments to seat said door in said closed position sealed against said access opening.

20. The heat insulated enclosure of claim 19 wherein a follower on one door segment is spaced closer to said median pivot axis than a follower on said other door segment and said spring means is connected therebetween to exert a greater pivoting movement on the other door segment than said one segment as said spring means moves across said median pivot axis.

* * * * *